United States Patent [19]

Igari

[11] Patent Number: 5,003,188

[45] Date of Patent: Mar. 26, 1991

[54] SEMICONDUCTOR WAXER DETECTION SYSTEM

[75] Inventor: Kazufumi Igari, Machida, Japan

[73] Assignee: Tokyo Aircraft Instrument Co., Ltd., Komae, Japan

[21] Appl. No.: 423,043

[22] Filed: Oct. 18, 1989

[30] Foreign Application Priority Data

Nov. 18, 1988 [JP] Japan .......................... 63-151003[U]
Nov. 18, 1988 [JP] Japan .......................... 63-151005[U]

[51] Int. Cl.$^5$ .............................................. H01J 40/14
[52] U.S. Cl. ................................. 250/561; 250/223 R; 414/274
[58] Field of Search ................ 250/561, 222.2, 223 R; 414/274, 331

[56] References Cited

U.S. PATENT DOCUMENTS

| | | |
|---|---|---|
| 3,824,020 | 7/1974 | Pease ................................. 250/223 R |
| 4,238,780 | 12/1980 | Doemens ............................ 250/561 |
| 4,259,019 | 3/1981 | Johannsmeier et al. ............ 250/561 |
| 4,625,666 | 12/1986 | Sick ..................................... 250/561 |
| 4,786,816 | 11/1988 | Ohmori et al. ..................... 250/561 |
| 4,803,373 | 2/1989 | Imamura et al. ................... 250/561 |
| 4,806,773 | 2/1989 | Hiraga et al. ....................... 250/548 |

Primary Examiner—David C. Nelms
Assistant Examiner—Stephone B. Allen
Attorney, Agent, or Firm—Spencer & Frank

[57] ABSTRACT

A wafer basket station includes a semiconductor wafer basket containing therein a number of semiconductor wafers and an elevating device which raises and lowers the wafer basket to bring a desired wafer in its taken out height. A wafer detecting device is formed with a transmission type optical sensor disposed inclined so that the optical axis thereof passes a center of a semiconductor wafer at the desired height, but not to pass adjacent wafers of the semiconductor wafer.

The elevating device of the wafer basket has an elevator which supports wafers to be worked and treated and is guided and driven vertically with respect to a base frame of the device. The elevator is provided with an opaque body. A photocoupler support plate is guided to move vertically and supported with respect to the base frame of the device. A spring means is energized in the departing direction away from the photocoupler support plate against the base frame. A screw adjusting means is rotatably supported while being restricted to move downwardly with respect to the base frame and connected with the support plate, so that by its rotation the relative position of the photocoupler and the base frame is adjusted.

3 Claims, 3 Drawing Sheets

PRIOR ART

SEMICONDUCTOR WAXER DETECTION SYSTEM

BACKGROUND OF THE INVENTION

1. Field of the Invention

The present invention relates to a semiconductor wafer basket station used for moving and transfering wafers in the process of manufacturing semiconductors.

2. Background Information

A wafer basket has been widely used to transport semiconductor wafers, to supply them for inspection or treating, and to receive them after inspection or treatment has been completed. The wafer basket is also called as a wafer carrier.

It is well-known that different wafer baskets are made for different diameter semiconducter wafers, each wafer basket receiving a number of semiconductor wafers, in most cases 25 wafers, and supporting each of them, with a narrow space between adjacent wafers.

FIG. 1 shows a perspective view of such a conventional wafer basket standing with semiconductor wafers therein.

When one or more of wafers must be taken out from the wafer basket station, it is advantageous to know beforehand whether a wafer or wafers is (are) contained in each of the wafer columns of the wafer basket. If so, failure of a wafer inserting and removing robot to remove a wafer from an empty location may be avoided. And collision of wafers may also be avoided.

In order to confirm the existence of wafers when using an elevating means to elevate a wafer basket, there has been a need for a detecting device for detecting the existence of wafers in the wafer basket. The inventors of the present invention have studied this need.

FIG. 2 is a schematic view showing the basic structure and the principle of the operation of a conventional wafer detecting device in a wafer basket. In the device shown, a reflection type sensor 25 or 26 is disposed so that its optical axis faces towards a center of a semiconductor wafer 15.

With this structure, by the movement of a wafer basket a semiconductor wafer 15 is brought to an optical axis of the sensor 25 or 26, and the sensor receives a reflection light from the wafer 15. Thus the existence of the wafer 15 may be confirmed.

However, the thickness of a wafer is as small as on the order of 0.5 mm, or so, and moreover wafers of various diameters are frequently used. Further, an orientation flat is formed on part of the circumference of a wafer to determine the orientation of the pattern formed on the wafer. These issues raise difficulties in the above mentioned device shown in FIG. 2.

If the diameters of the wafers differ, reflected; light may be still obtained as long as the optical axis of the reflection sensor 25 or 26 is pointed towards the center of the semiconductor wafer. However, because of the difference in the distance to the wafer, the quantity of reflected light varies with the diameter.

If the center of a wafer displaced into a position as shown by the broken line in FIG. 2, it becomes difficult to obtain any reflected light.

In order to avoid the influence of the orientation flat on the circumference of the wafer, two reflection type sensors 25 and 26 may be used so as to receive reflected light by either of the sensors 25 and 26. However, when the position of the wafer is displaced as in FIG. 2, similar problems arise.

In order to take out semiconductor wafers one by one, the height of an elevating device supporting the wafer basket must be adjusted so that the height of the wafer to be taken out is suitable for the operational position of a take-out robot.

It is troublesome to adjust the height each time when taking out a wafer, so it is wise to precisely determine the initial height of the elevating device at the start of operation of the device. The elevating device may then be moved for pitches corresponding to a received semiconductor wafer by a pulsed motor.

A wafer basket having an elevating device which supports and elevates the wafer basket provided with a fine adjustment for the initial stop position of the elevating device is known.

FIG. 3 is a side view of such a conventional elevating device having a stop position fine adjustment.

In the device shown, with a base plate 7, which is fixed to a base frame, not shown, a photocoupler 5 is fixed.

On an elevating stand 2, a wafer basket 1 is placed, and the elevating stand 2 is vertically movable with respect to the basic frame of the device. The vertical movement is driven with an elevating motor, not shown.

The stand 2 is provided with an integral support plate 3 for an opaque plate 4 fixed to the support plate 3.

The elevating stand 2 is moved upwardly from its lowest position with respect to the basic frame of the device by the elevating motor, and when an upper end of the opaque plate 4 obstructs the optical path of the photocoupler 5, the motor is stopped to set an initial position.

In the opaque plate 4, slots 4a, 4b, are provided, so the relative position of the opaque plate 4 with respect to the elevating stand 2 may adjusted by loosening and re-tightening screws 3a, 3b, respectively. Thus, an initial position may be set.

In this example, adjustment of the initial stop position is possible. This adjustment must be made for each wafer basket used or at least each kind of wafer basket. The preciseness in the adjustment, on the order of 0.1 mm or so, must be maintained. The adjustment in this conventional device is however not simple.

An object of the present invention is therefore to provide a wafer basket having a semiconductor wafer sensing means, which can correctly detect the existence of a wafer or wafers in the basket, even if there are a variety of sizes or displacements of the center of the wafer or wafers.

Another object of the present invention is to provide a wafer basket having an elevating device with a stop position fine adjusting means, which can easily adjust the relative position of a photocoupler and an opaque plate, in order to set a stop position of the elevating device which can then vertically move the wafer basket in which wafers are received.

SUMMARY OF THE INVENTION

The wafer basket station according to the present invention includes a semiconductor wafer basket containing therein a number of semiconductor wafers and an elevating device which raises and lowers the wafer basket to bring a desired wafer to its removal height. A wafer detecting device is formed with a transmission type optical sensor disposed inclined so that the optical axis thereof passes through a center of a semiconductor wafer at the desired height, but does not pass through adjacent wafers of the semiconductor wafer basket.

The elevating device of the wafer basket has an elevator which supports wafers to be worked and treated, and is guided and driven vertically with respect to a base frame of the device. The elevator is provided with an opaque body. A photocoupler support plate moves vertically and supported with respect to the base frame of the device. A spring means pushes away from the photocoupler support plate against the base frame. A screw adjusting means is rotatably supported while being restricted to move downwardly with respect to the base frame and is connected with the support plate, so that by its rotation the relative position of the photocoupler and the base frame is adjusted.

DESCRIPTION OF THE PREFERRED EMBODIMENTS

The present invention will be explained in further detail with respect to the attached drawings.

Figure 4:
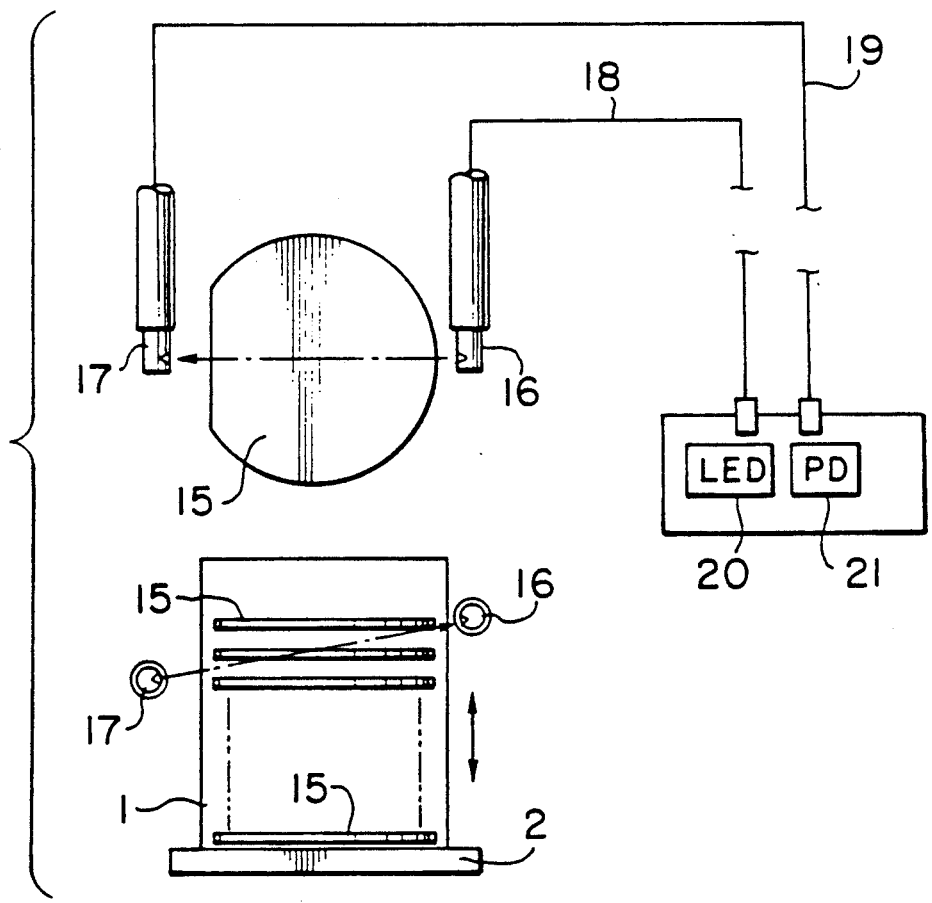
FIG. 4 is a schematic view showing the fundamental structure and the principle of operation of an embodiment of a wafer detecting device within a wafer basket station according to the present invention.

In FIG. 4 which is a schematic view showing the fundamental structure and the principle of operation of an embodiment of a wafer detecting device according to the present invention within a wafer basket station.

Figure 1:
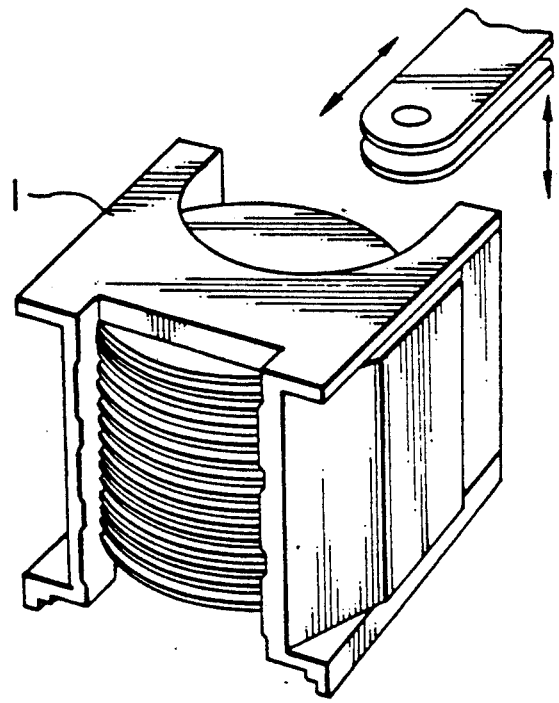
FIG. 1 is a perspective view of a conventional wafer basket standing with semiconductor wafers therein.
Figure 2:
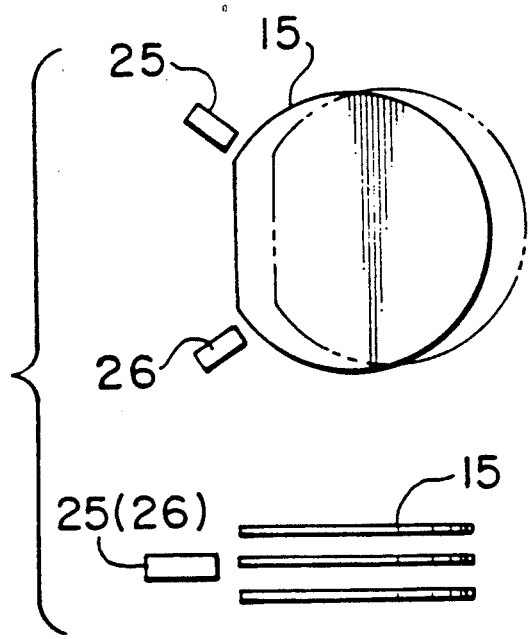
FIG. 2 is a schematic view showing the fundamental structure and the principle operation of a conventional wafer detecting means within a wafer basket station.
Figure 3:
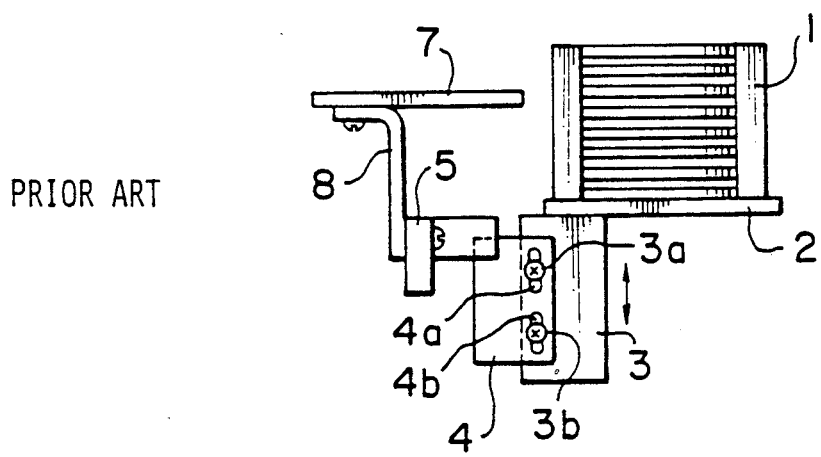
FIG. 3 is a side view of a conventional elevating device having a stop position fine adjustment.

In a wafer basket 1 (as shown in FIG. 1), a number of semiconductor wafers 15 are contained, and an elevating stand 2 of an elevating device is driven by a motor, not shown, and moved vertically to bring a semiconductor wafer to a certain height for insertion and taking up.

An optical axis is formed for a transmission type optical sensor on a line connecting a projection head 16 and a head 17 of a light receiving sensor. The heads 16 and 17 are disposed at different height positions, as shown, and also do not disturb the vertical movement of the wafer basket 1, and are disposed so that the optical axis between the heads 16 and 17 passes through a center of a semiconductor wafer 15 at the height for insertion or taking-up without being affected by adjacent wafers.

Light from a projecting element (LED) 20 is provided to the projecting head 16 by transmission through an; optical fiber 18, and received light, photoelectrically transferred by the head 17 of the light receiving sensor, is transmitted to a light receiving element (PD) 21 through an optical fiber 19.

In case the wafer 15 is present in a certain position, the light is obstructed, and when the wafer 15 is not present at the position, the optical path is not obstructed. Therefore, existence of the semiconductor wafer in the position can be detected. In the present invention, it is more important to know the non-existence of a semiconductor wafer in the position.

As explained above, in the wafer detecting device within a wafer basket station according to the present invention, the optical axis of the light transmission type optical sensor is disposed so that it passes an idealized center of a wafer at a certain desired height and simultaneously it is displaced from and not obstructed by the adjacent semiconductor wafers.

Existence of the wafers may be detected notwithstanding some displacement of wafers or different wafer size.

Figure 5:
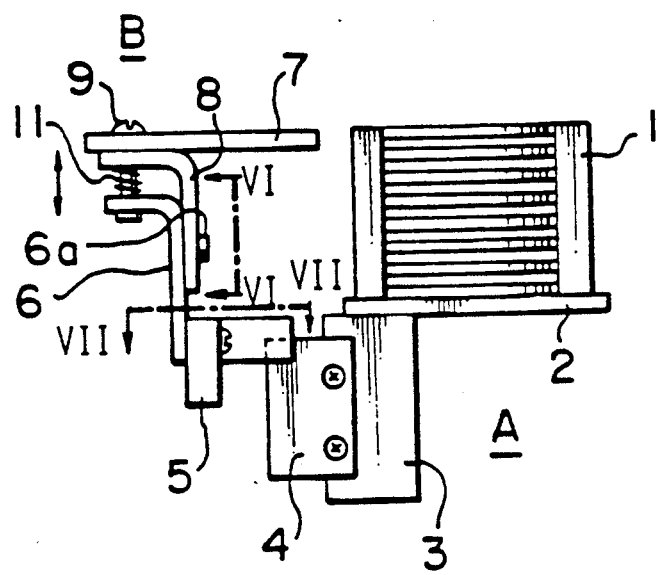
FIG. 5 is a side view of an embodiment of an elevating device according to the present invention, which has a stop position fine adjustment.

FIG. 5 is a side view of an embodiment of an elevating device according to the present invention, which has a stop position fine adjustment means.

Figure 6:
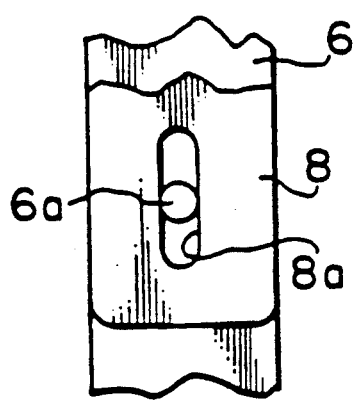
FIG. 6 is a view between A and A in FIG. 5, the view showing a guide mechanism used in the embodiment of FIG. 5.
Figure 7:
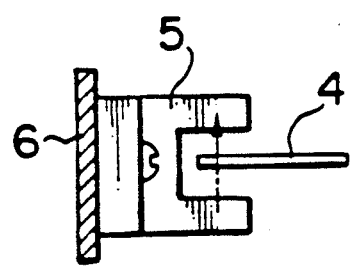
FIG. 7 is a view between B and B of FIG. 5, which represents an optical position detecting part used in the embodiment of FIG. 5.

FIG. 6 is a view showing a guide mechanism between A and A in FIG. 5, which is used in the embodiment of FIG. 5. FIG. 7 is a view seen between B and B of FIG. 5 for showing an optical position detecting station used in the embodiment of FIG. 5.

In the wafer basket elevating device A is provided with an elevating stand 2 shown in FIG. 5, which is guided and driven vertically by a guide means (FIG. 6) and a motor (not shown). On the elevating stand 2, a wafer basket 1 (shown in FIG. 1) is mounted.

To the base frame of the device, a stop position fine adjustment portion B is provided, which fine adjusts an initial stop position of the elevating stand 2.

To the elevating stand 2 an opaque plate supporting plate 3 is integrally provided, the plate 3 fixing and supporting an opaque plate 4.

An L-shaped guide 8 is fixed to a lower face of a base plate 7. The guide 8 is provided with a long guide slot 8a, as shown in FIG. 6.

Likewise, a photocoupler 5 is fixed to a lower face of an L-shaped photocoupler support plate 6. A pin 6a provided in the photocoupler support plate 6 is engaged with the guide slot 8a.

The relationship between the photocoupler 5 and the opaque plate 4 in the elevating device side is shown in FIG. 7.

At the contacting portion of the base plate 7 and the guide 8, a through hole is provided, and a coil spring 11 is inserted between the hole of the guide plate 8 and an upper face of the photocoupler support plate 6. A threaded shaft of an adjustment screw 9 inserted through the coil spring 11 is connected with a female portion of the photocoupler support plate 6.

A head of the adjustment screw 9 protrudes from the upper face of the base plate 7. If the screw 9 is a plus thread, adjustment may easily be made only by rotating this fine adjustment screw 9 by the plus driver.

As fully explained, in the elevating device having the stop position fine adjustment means according to the present invention, an opaque plate 4 is provided, and a photocoupler support plate 6 is supported by the base frame of the device movably in the vertical direction and guided so as to move straightly. The photocoupler support plate 6 is pushed by a spring 11 away from the base frame. An adjustment screw means is provided, which is rotatably supported but limited in downward movement with respect to the base frame side. The adjustment screw means is connected with the support plate 6 and the relative position between the photocoupler 5 and the base frame may be adjusted by the rotation of the screw 9.

Thus, adjustment time may be shortened. And readjustment is easily made for different wafer baskets used.

What is claimed is:

1. A wafer detection system, for use in detecting the absence of a semiconductor wafer at a location in a wafer basket, comprising:

a wafer basket station having a base including:
   (a) a wafer basket for containing a plurality of wafers therein at a plurality of wafer positions having parallel shelves, said basket being movable vertically with respect to the base so that wafers may be placed therein and wafers present on said shelves are accessible for removal and being worked on; and
   (b) elevating means for moving said wafer basket vertically with respect to the base of the station to plurality of heights;
   emitting means for outputing a beam of energy along an axis at an angle to said parallel shelves and which the approximate center of a single one of said wafer positions in the wafer basket when said wafer basket is at one of said plurality of desired heights, such that said beam of energy impinges only the approximate center of a wafer present in said single one of said wafer positions and does not impinge on any adjacent wafers in the wafer basket; and
   sensor means for sensing said beam of energy output by said emitting means only when a wafer is not present in said single one of said wafer positions and said basket is at one of said desired heights, the absence of a wafer at one of the wafer positions in the wafer basket when the wafer basket is at one of the plurality of desired heights being detected by the sensing of the beam of energy by the sensor means.

2. The wafer detection system of claim 1, wherein said wafer station further comprises:
   a base plate;
   a moveable guide plate, attached to said base plate, and having a guide slot;
   a moveable support plate, having a guide pin which moves in the guide slot;
   a photocoupler, attached to said support plate, having an interruptable beam;
   an opaque body, attached to said wafer basket, for interrupting the beam of said photocoupler when said wafer basket is at a certain height with respect to said base plate; and
   a fine adjusting assembly, including a compression spring and a screw, said spring being located between said guide plate and said support plate and exerting a separating force therein, said screw passing through said base plate, said guide plate, and said compression spring, and being rotatably connected to said support plate, so that turning said screw adjusts the relative position of said photocoupler with respect to said base plate;
   whereby the relative height of the wafer basket with respect to the base plate may be adjusted by turning said screw until the opaque body blocks the photocoupler beam.

3. A wafer basket height setting system, for a wafer station having a base and a wafer basket moveable vertically with respect to said base, comprising:
   a base plate;
   a moveable guide plate, attached to said base plate, and having a guide slot;
   a moveable support plate, having a guide pin which moves in the guide slot;
   a photocoupler, attached to said support plate, having an interruptable beam;
   an opaque body, attached to said wafer basket, for interrupting the beam of said photocoupler when said wafer basket is at a certain height with respect to said base plate; and
   a fine adjusting assembly, including a compression spring and a screw, said spring being located between said guide plate and said support plate and exerting a separating force thereon, said screw passing through said base plate, said guide plate and said compression spring, and being rotatably connected to said support plate so that turning said screw adjusts the relative position of said photocoupler with respect to said base plate, whereby the relative height of the wafer basket with respect to the base plate may be adjusted by turning said screw until the opaque body blocks the photocoupler beam.

* * * * *

UNITED STATES PATENT AND TRADEMARK OFFICE
CERTIFICATE OF CORRECTION

PATENT NO. : 5,003,188
DATED : March 26, 1991
INVENTOR(S) : Kazufumi IGARI

It is certified that error appears in the above-identified patent and that said Letters Patent is hereby corrected as shown below:

ON TITLE PAGE:
Please correct the title to --

[54] SEMICONDUCTOR WAFER DETECTION SYSTEM --

Signed and Sealed this

First Day of September, 1992

Attest:

DOUGLAS B. COMER

*Attesting Officer*  *Acting Commissioner of Patents and Trademarks*